United States Patent [19]

Ferraiolo et al.

[11] Patent Number: 5,212,716
[45] Date of Patent: May 18, 1993

[54] DATA EDGE PHASE SORTING CIRCUITS

[75] Inventors: Frank D. Ferraiolo, New Windsor, N.Y.; John E. Gersbach; Ilya I. Novof, both of Burlington, Vt.

[73] Assignee: International Business Machines Corporation, Armonk, N.Y.

[21] Appl. No.: 650,516

[22] Filed: Feb. 5, 1991

[51] Int. Cl.$^5$ .............................................. H03D 3/24
[52] U.S. Cl. ................................... 375/119; 328/56
[58] Field of Search .................. 375/80, 81, 82, 83, 375/106, 111, 113, 119, 120, 118; 328/55, 56, 63, 72; 371/42

[56] References Cited

U.S. PATENT DOCUMENTS 4,746,872  5/1988  Yamagata .............................. 375/84

Primary Examiner—Stephen Chin
Attorney, Agent, or Firm—Heslin & Rothenberg

[57] ABSTRACT

Data edge phase sorting circuits for communication systems and information and data processing systems employing digital phase locked logic circuits. The sorting circuits phase sort edge transitions of a serial data stream relative to a local clock signal. The local clock signal is coupled to a delay line having a plurality of serially connected delay elements, each of which outputs a delay clock of different phase. The sorting circuit includes an extraction circuit coupled to receive the serial data stream for detecting edge transitions in the serial stream and outputting a pulse of predefined duration in response to each detected transition. Coupled to the extraction circuit output is a non-sequential logic circuit, which is also coupled to the local clock through the delay line. The non-sequential logic circuit combines the outputted extraction circuit pulse and the plurality of delay clocks for sorting the pulse relative to the delay clocks. Specific embodiments for the extraction circuit and non-sequential logic circuitry are depicted and described herein.

20 Claims, 4 Drawing Sheets

DATA EDGE PHASE SORTING CIRCUITS

BACKGROUND OF THE INVENTION

CROSS-REFERENCE TO RELATED APPLICATION

This application is related to commonly assigned application Ser. No. 07/594,242 filed Oct. 9, 1990, by Ferraiolo et al. The entire disclosure of this copending application is hereby incorporated herein by reference.

TECHNICAL FIELD

This invention relates in general to communication systems and information and data processing systems, and more particularly, to digital phase locked logic circuits employing data edge transition sorting circuitry.

DESCRIPTION OF THE PRIOR ART

Phase locked loops (PLLs) are a critical component in many data communication networks. PLLs are used for locally maintaining in remote stations a clock signal that corresponds in frequency and phase to the clock of data signals transmitted through the network and received by the station. The difference between a VCO generated signal and the clock signal recovered from the received data is monitored and the phase and frequency of the VCO signal is adapted and "locked" to that of the received data signal.

Progress in increasing performance, speed, reliability, and the simultaneous reduction in size and cost of integrated circuits (LSI and VLSI) continues to create strong interest in the implementation of PLLs in the digital domain. Aside from the obvious advantages associated with digital systems, a digital version of the PLL (DPLL) alleviates some of the problems associated with its analog counterpart; namely, sensitivity to noise and parameter variations, difficulties encountered in building higher order loops, and, depending on the system, the need for initial calibration and periodic adjustments. Various digital phase locked logic circuits are described in the literature. An early survey is given in an article by W. C. Lindsey et al., entitled "Survey of Digital Phase-Locked Loops," Proceedings of the IEEE, Vol. 69, No. 4, April 1981, pp. 410-431.

A principal use for circuitry to phase sort edge transitions of a received data stream is in facilitating extraction of a data retiming signal. A generalized embodiment of a data retiming circuit, denoted 10, is depicted in FIG. 1. Retiming circuit 10 includes a digital phase locked logic circuit (DPLL) 12, a clock phase generator 14, a multiplexer 16 and an edge triggered D-latch 18. As noted above, DPLLs are now well known in the art and will therefore not be described in detail herein. In operation, a serial stream of clock and data signals to be retimed, and subsequently deserialized, is received on line 13 which is coupled to an input of DPLL front end circuit 15. DPLL front end circuit 15 results from a somewhat arbitrary division of DPLL 12. Circuit 15 receives from generator 14 on line 17 a plurality of clock signals of different phase. Generator 14 and circuit 15 components may include, for example, a local clock generator, a clock delay line and data edge sorting circuitry. One circuit embodiment of these components is described by E. A. Zurfluh in U.S. Pat. No. 4,677,648, entitled "Digital Phase Locked Loop Synchronizer," assigned to the same assignee as the present invention, the entirety of which is hereby incorporated herein by reference. (These circuit components are briefly described below with reference to the prior art circuit depicted in FIG. 2.)

DPLL front end circuit 15, through its data edge sorting circuitry (FIG. 2), outputs a plurality of pulse signals S(1), S(2) . . . S(n-1) & S(n) on an equivalent number of lines 19, which are coupled to a choose correct clock circuit 20. Circuits 15 & 20 essentially comprise digital phase locked logic circuit 12, as shown in phantom in FIG. 1. The n outputs S(1), S(2) . . . S(n-1) & S(n) from circuit 15 represent discrete time intervals relative to the DPLL local clock. The leading edge of one time interval occurs precisely at the trailing edge of the previous interval. In one implementation, a pulse signal for each data edge transition of the serial stream is provided on a corresponding one of the n outputs of circuit 15 to signify the location and time of the transition relative to the DPLL local clock.

Choose correct clock circuit 20 operates to select a proper local clock phase for use in data retiming from a plurality of local clocks of identical frequency but different phase. The cross-referenced application is specifically directed to this DPLL function. As described therein, clock selection is made based upon an analysis of the historical distribution of a predefined number of sorted data edge transitions. An identification of a selected clock signal is output from DPLL 12 on line 21 to a multiplexer 16 which also receives as input (on line 23) a plurality of local clock signals of different phase produced by clock phase generator 14. The output (on line 25) of multiplexer 16 is fed to the clock input "C" of the edge triggered data latch 18. A second data input "D" to latch 18 is coupled to line 13 for receiving the serial data stream. Data is latched on either the rising or falling clock edge. Retimed data is output from latch 18 on line 27, for example, to a deserialization circuit (not shown).

Existing high speed DPLLs, such as the DPLL described in the referenced Zurfluh patent, typically use a sequential logic circuit, such as a flash register in combination with transition detector logic, to phase sort incoming data edges in reference to the local master clock (see FIG. 2). As shown in FIG. 2, data edge transition sorting circuit 30 receives the incoming data stream on line 31 at an input to a Schmitt trigger 32, which operates to provide clean data transitions to the sequential logic circuitry. Simultaneous therewith the local clock 34 is fed to a delay line 36 to generate a family of delay clocks f(0), f(1) . . . f(n-1) & f(n). Each delay clock has the same frequency as the master clock but a different phase. These delay clocks serve as an input to a flash register 38. Flash register 38 comprises a series of latches, e.g., D-flip flops, which are clocked by the transitions generated by Schmitt trigger 32 in response to the data edge transitions in the received serial stream. Flash register 38 captures the state of the received data line at each phase of the delay clocks f(0), f(1) . . . f(n-1) & f(n). Transition of the input data is then deduced by the transition detector to have occurred between the two clock phases where the corresponding registers contain complimentary data. Transition detector 40 thus activates one of the S(1), S(2) . . . S(n-1) & S(n) outputs on each cycle of the local clock.

An important drawback to this conventional sorting approach arises from the fact that the flash register consists of a plurality of master and slave latches, e.g., D-latches. With asynchronous DPLL flash register operation there is a significant probability that one or more of the D-latches could become metastable. Once this occurs the circuitry produces erroneous sorting of consequent edge transitions, thus generating data error. Various techniques are in use presently to decrease this latch metastability problem to acceptably low levels. However, these techniques typically increase circuit complexity and power consumption.

Thus, the DPLL edge phase sorting technique described herein is designed to improve upon the performance limitations of existing digital data sorting circuit technology and, in particular, to improve circuit reliability and accuracy by eliminating the prior art circuit metastability problem.

SUMMARY OF THE INVENTION

Briefly described, this invention comprises in a broad aspect a circuit for phase sorting an edge transition of a serial data stream relative to a local clock signal. The local clock signal is coupled to a delay line having a plurality of serially connected delay elements, each of which outputs a delay clock of different phase. The transition sorting circuit includes an extraction circuit coupled to receive the serial data stream for detecting the edge transition in the serial data stream and outputting a pulse in response thereto. Coupled to the extraction circuit is a non-sequential logic circuit, which is also coupled to the local clock through the delay line. The non-sequential logic circuit combines the outputted extraction circuit pulse and the plurality of delay clocks for sorting the pulse relative to the delay clocks.

In an enhanced embodiment, the circuit sorts a plurality of transitions of the data stream, and the extraction circuit detects at least one of the rising edge type transitions and falling edge type transitions of the stream and outputs a pulse in response to each detected edge transition. Preferably, the pulse output from the extraction circuit has a duration Q, the length Q being less than the delay length of each delay line delay element. Further, the non-sequential logic circuit may comprise n substantially identical combinational logic circuit cells. The mth cell includes an AND gate having a first input and a second input, the first input to the AND gate being coupled to receive the extraction circuit output pulse. The cell also includes an AnB logic circuit which has a first input and a second input. The first input to the AnB logic circuit is coupled to receive the f(m-1) delay clock and the second input to the AnB logic circuit is coupled to receive the f(m) delay clock, wherein m=1,2...n. The output of the AnB logic circuit is coupled to the second input of the AND gate. Additional circuit enhancements are described and claimed herein.

The novel phase sorting circuit of the present invention improves upon the performance limitations of existing digital data sorting circuit technology in large part by eliminating the metastability problems associated with prior art sequential logic sorting circuits while simultaneously reducing circuit complexity and power consumption. Further, sorting circuit accuracy is improved (e.g., doubled) pursuant to the invention, notwithstanding use of same local clock signal and associated delay line.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

DETAILED DESCRIPTION OF THE INVENTION

Figure 1:
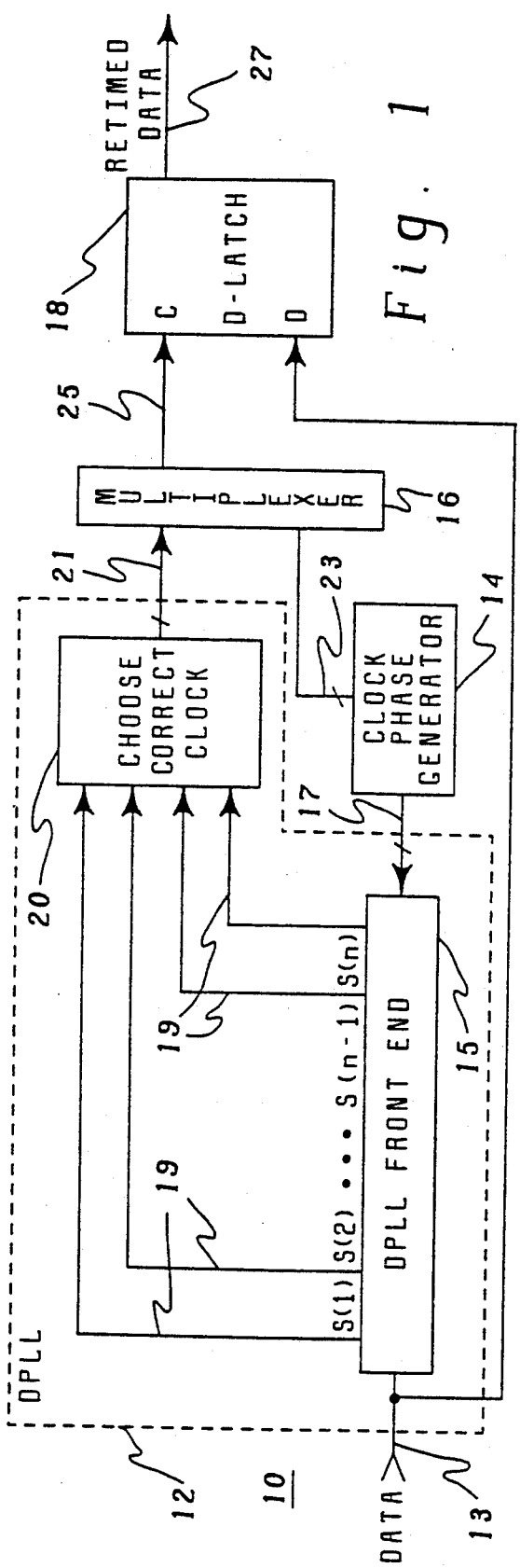
FIG. 1 is a block diagram representation of a DPLL data retiming circuit.
Figure 2:
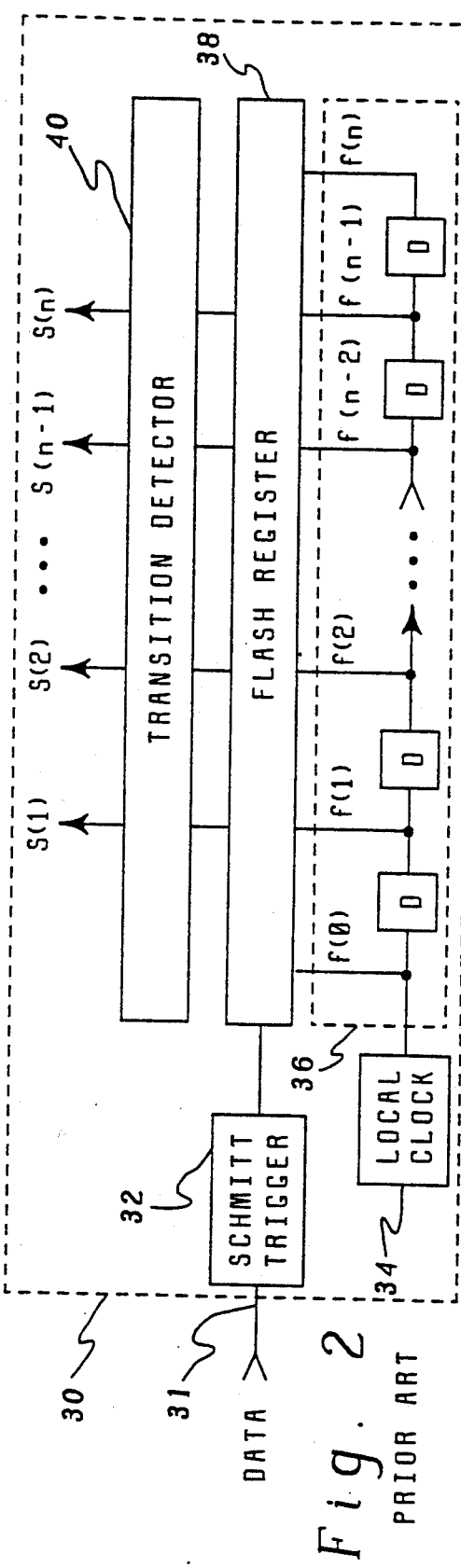
FIG. 2 is a block diagram representation of a prior art data edge phase sorting circuit.
Figure 3:
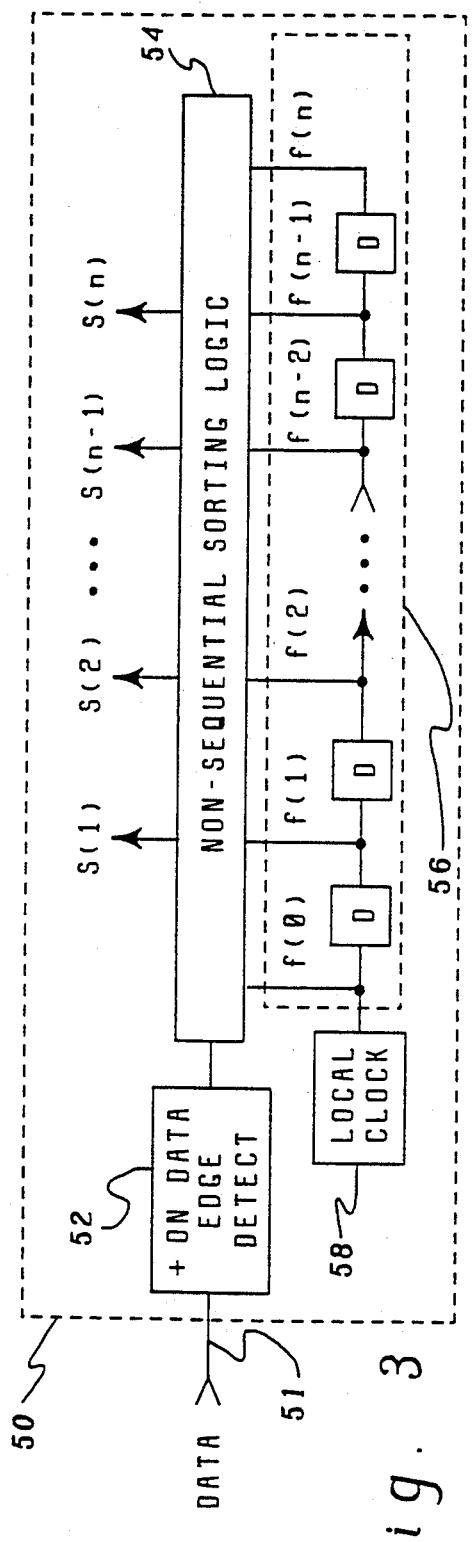
FIG. 3 is a block diagram representation of a data edge phase sorting circuit pursuant to the present invention.

One preferred embodiment of a data edge transition sorting circuit pursuant to the present invention is depicted in FIG. 3. A serial stream of data signals and clock signals is fed via line 51 to + on data edge detection circuit 52. As explained further below, the rising, falling, or both the rising and falling, data edge transitions may be extracted with an appropriate one of the various + on data edge detect circuits depicted in FIGS. 6-8. Circuit 52 generally comprises a single shot pulse generator which provides, for example, a positive output pulse to a non-sequential sorting logic circuit 54 upon receipt of a data edge transition of the desired type. (Alternatively, circuit 52 could be configured to provide a negative output pulse to sorting logic circuit 54 upon receipt of a data edge transition of the desired type. Also, if desired, a Schmitt trigger may be coupled to line 51 to proceed edge detect circuit 52. As is known in the art, the Schmitt trigger would operate to provide a cleaner and faster transition for subsequent processing.) Non-sequential sorting logic 54 compares these output pulses from detect circuit 52 with a plurality (n) of delay clocks f(0), f(1) ... f(n-1), f(n) generated by a delay line 56 driven by the local master clock 58. Non-sequential sorting logic 54 outputs signals S(1), S(2) ... S(n-1), S(n), which again flag a data edge transition location relative to the local clock. As described in the cross-referenced application, the frequency of occurrence of each sorted output is preferably stored in order to subsequently deduce the position of an average data transition and thus facilitate the selection of an optimum retiming signal.

Figure 4:
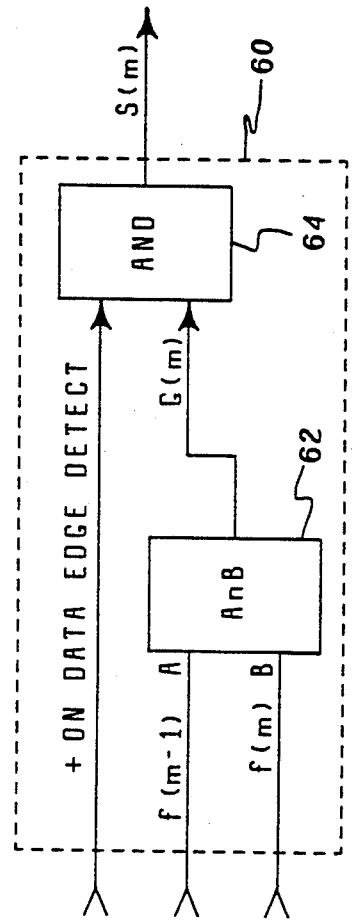
FIG. 4 is a block diagram representation of one embodiment of the combinational logic circuit cell implemented within the non-sequential sorting logic block of FIG. 3.

Pursuant to the present invention, logic circuit 54 comprises a plurality of identical combinational logic circuit cells such as that circuit cell, denoted 60, depicted in FIG. 4. In this embodiment, there is a corresponding combinational logic circuit cell 60 for each circuit 54 output signal S(1), S(2) ... S(n-1) & S(n). Logic circuit 60 includes an "A not B" (AnB) circuit 62 and an AND gate 64. For the mth logic circuit cell 60 (wherein m=1,2 ... n-1 & n) the f(m-1) and f(m) clocks from delay line 56 are applied correspondingly to the A and B inputs of AnB circuit 62, which has the following truth table:

| A | B | AnB |
|---|---|-----|
| 0 | 0 | 0 |
| 0 | 1 | 0 |
| 1 | 0 | 1 |
| 1 | 1 | 0 |

(As used herein an AnB logic circuit comprises an an gate having an inverter or a 'B' input thereto.) The output of the AnB circuit 62, i.e., pulse G(m), has the phase shift of the f(m-1) clock and the duration of the (m-1) delay element in the delay line 56 (FIG. 3). Output pulse G(m) of AnB circuit 62 is fed to one input of AND gate 64. The output pulse from transition detect circuit 52 (FIG. 3) is fed to the other input of AND gate 64. An AND circuit output S(m) of logic 1 indicates that the data edge transition is positioned between the f(m-1) and f(m) delay clocks, i.e., at least partially. In particular, if a data edge transition is sorted simultaneously as S(m-1) and S(m) it means that the transition detect pulse from circuit 52 (which, as discussed below, is of a predefined duration) began before the f(m-1) clock and terminated subsequent to the f(m-1) clock. If the data edge transition is sorted as only S(m) then the transition detect pulse occurred between the f(m-1) and f(m) clocks.

Figure 5:
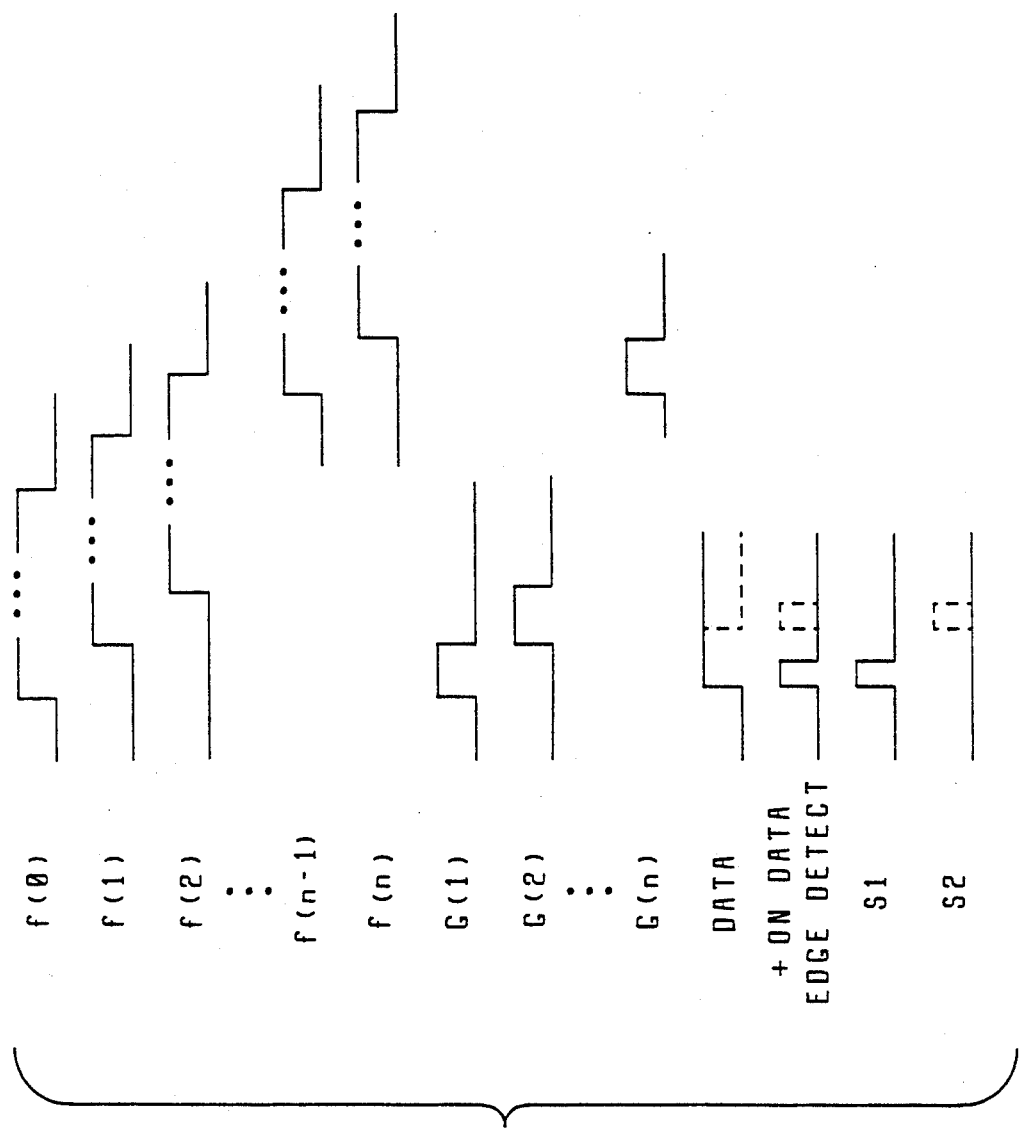
FIG. 5 is a sample timing diagram for the data edge phase sorting circuit of FIG. 3.

An edge sort timing diagram is depicted in FIG. 5. Delay clocks f(0), f(1), f(2) . . . , f(n-1) & f(n) are obtained from delay line 56 (FIG. 3) by non-sequential sorting logic 54 (FIG. 3) and, in particular, are respectively provided to the corresponding cell's AnB circuit 62 (FIG. 4). The outputs of circuits 62 comprise pulses G(1), G(2) . . . , G(n). The width of each pulse G(m) is equal to the delay of the (m-1) delay element in delay line 56. By way of example, if a rising data transition results in the + on data edge detect pulse timed as depicted, then the AND gate of the first combinational logic circuit cell 60 in non-sequential sorting logic 54 produces an output signal pulse S(1) while both G(1) and + data edge detect pulse are high (as shown). By way of further example, if a falling data edge transition (shown in phantom) is timed to coincide with pulse G(2) this results in a signal pulse S(2) (shown in phantom) being output from the second combinational logic circuit cell 60 of non-sequential sorting logic 54.

Figure 6:
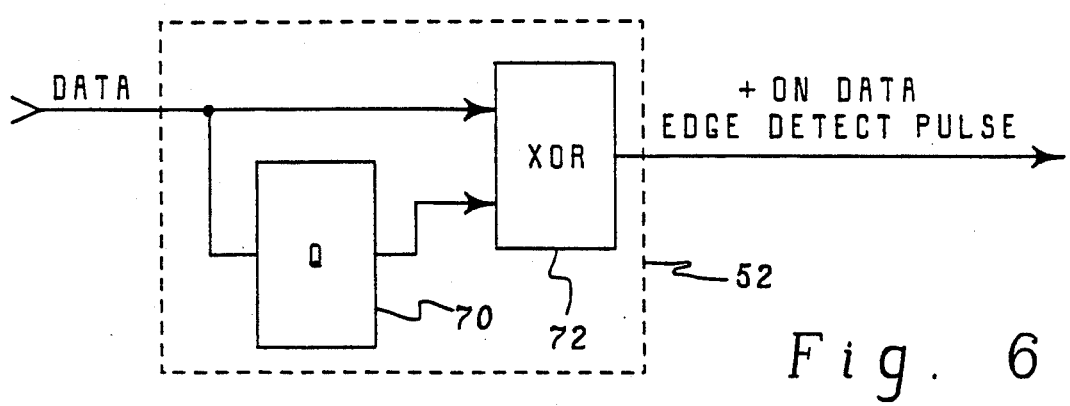
FIG. 6 is a block diagram representation of one embodiment of the + on data edge detect circuit of FIG. 3 for identifying rising and falling data edge transitions.

Depending upon the application, it may be desirable to detect the rising edge, the falling edge, or both the rising and falling data edge transitions in the received serial data stream. FIG. 6 depicts one preferred embodiment for a + on data edge detect circuit 52 which produces an output pulse for both rising and falling edge transitions. In this embodiment, the data stream is fed simultaneously to a delay element 70 (which has a delay length Q), and a first input of an exclusive OR (XOR) circuit 72. As a practical example, the delay Q of element 70 may satisfy the following condition:

$$0.5 \cdot D < Q < D$$

where D is the delay length in one delay line 56 delay element (FIG. 3). The lower limit for Q is arbitrary and depends upon the particular circuit implementation. However, with respect to the upper limit, accuracy diminishes if delay length Q equals or is greater than the delay length D of the delay line delay elements. Preferably, duration Q is one-half delay length D, which operates to effectively double the accuracy of the phase sorting circuit since one or two pulse signals S(1), S(2) . . . , S(n-1) & S(n) may be output for each transition depending upon when the + on edge detect pulse occurs relative to the phase delayed clocks f(0), f(1) . . . , f(n-1) & f(n).

In operation, when a rising data edge transition occurs an output pulse from XOR circuit 72 is produced since the first input to the circuit is high and the second input to the circuit (coupled to the output of delay element 70) is low. The length of the pulse output will be equal to delay length Q of element 70. Similarly, when a falling data edge transition occurs, an output pulse is also provided by XOR circuit 72 since the first input to the circuit is low while the second input remains high as a result of delay element 70. Again, the width of the output pulse is equivalent to delay length Q, i.e., the time it takes the second input to XOR circuit 72 to respond to a falling data edge transition by changing state.

Figure 7:
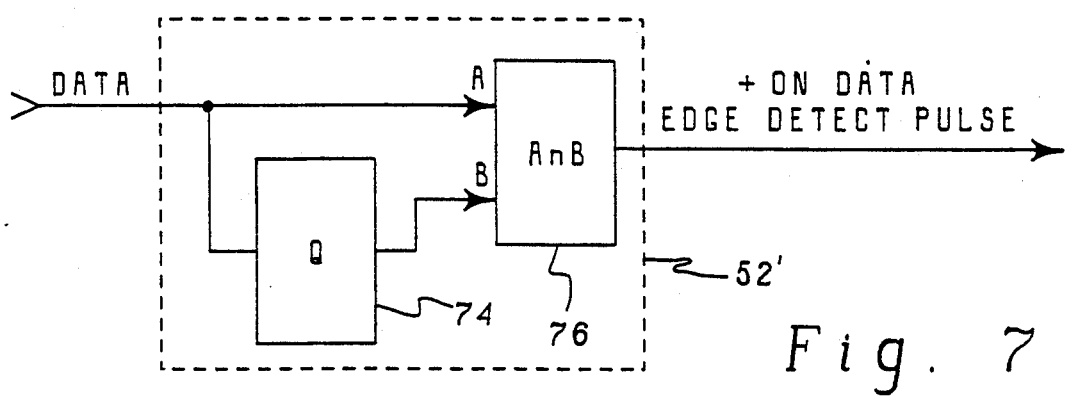
FIG. 7 is a block diagram representation of one embodiment of the + on data edge detect circuit of FIG. 3 for identifying rising data edge transitions.

FIG. 7 depicts one embodiment of a + on data edge detect circuit 52' for extracting only rising data edge type transitions. In this embodiment, circuit 52' includes a delay element 74 and an AnB circuit 76. Circuit 76 has the same truth table as that provided above for circuit 62 of FIG. 4. The AnB circuit again has an A input and a B input. The A input receives the serial data stream from line 51 (FIG. 3), while the B input receives the same serial data stream after being delayed via element 74, which again has a delay length Q. When a rising data edge transition occurs, the A input to circuit 76 goes high while the B input to the circuit remains low for a length of time equal to duration Q. This results in an output pulse from AnB circuit 76 equal in length to delay Q. Once input B to circuit 76 goes high then the output pulse therefrom is terminated.

Figure 8:
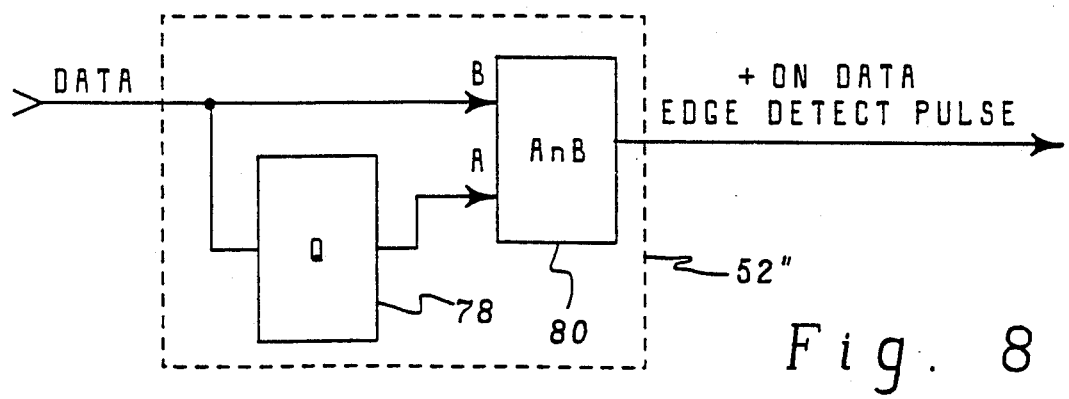
FIG. 8 is a block diagram representation of one embodiment of the + on data edge detect circuit of FIG. 3 for identifying falling data edge transitions.

A + on data edge circuit 52" embodiment for detecting only falling data edge type transitions is set forth in FIG. 8. Circuit 52" also includes a delay element, labelled 78, and an AnB circuit, denoted 80. In this configuration, the B input to circuit 80 receives directly the serial data stream while the A input to the circuit receives the same data stream only delayed by delay element 78. Thus, when input data falls from a high level to a low level the B input responds instantaneously while the A input remains high for a period of time equal to delay length Q, which produces an output pulse from circuit 80 pursuant to the truth table provided above.

It will be observed from the above discussion that a novel data edge phase sorting technique for a DPLL is described. The sorting technique utilizes only combinational logic circuitry and therefore eliminates the prior art problems experienced with sequential sorting logic. The circuit is therefore more accurate and simplier to implement than preexisting approaches.

Although specific embodiments of the present invention have been illustrated in the accompanying drawings and described in the foregoing detailed description, it will understood that the invention is not limited to the particular embodiments described herein, but is capable of numerous rearrangements, modifications, and substitutions without departing from the scope of the invention. The following claims are intended to encompass all such modifications.

What is claimed is:

1. A circuit for phase sorting an edge transition of a serial data stream relative to a local clock signal, said local clock signal being coupled to a delay line having a plurality of serially connected delay elements, each of said delay elements outputting a delay clock of different phase, said transition sorting circuit comprising:

an extraction circuit coupled to receive said serial data stream for detecting said edge transition in the serial stream and outputting a data edge detect pulse of predetermined length in response thereto; and nonsequential logic circuitry coupled to the output of said extraction circuit and to the local clock through said delay line, said nonsequential logic circuitry receiving said outputted extraction circuit pulse and said plurality of delay clocks for sorting said pulse relative to said delay clocks.

2. The transition sorting circuit of claim 1, wherein said serial data stream includes a plurality of edge transitions definitive of clock signals and data signals and wherein said transition sorting circuit sorts a plurality of said data stream edge transitions.

3. The transition sorting circuit of claim 2, wherein said extraction circuit detects at least one of rising edge type transitions and falling edge type transitions of the serial data stream and outputs a data edge detect pulse of predetermined length in response to each detected edge transition.

4. The transition sorting circuit of claim 3, wherein said extraction circuit detects both of said rising edge type transitions and said falling edge type transitions of the serial stream and outputs a data edge detect pulse of predetermined length in response to each detected edge transition.

5. The transition sorting circuit of claim 3, wherein each said data edge detect pulse of predetermined length output from said extraction circuit is of a predefined duration Q, duration Q being less than the length of the delay of each said delay line delay element.

6. The transition sorting circuit of claim 5, wherein each of said delay line delay elements has a delay length D and wherein said duration Q is approximately one-half said delay length D.

7. The transition sorting circuit of claim 2, wherein said extraction circuit detects rising edge transitions of the serial data stream and outputs a data edge detect pulse of predetermined length in response to each detected transition, said extraction circuit further comprising:

a delay element having a delay length Q; and an A not B logic circuit having an A input and a B input, the A input to said A not B logic circuit and an input to said delay element each being coupled to receive the serial data stream, the output of said delay element being coupled to the B input of said A not B logic circuit, an output pulse from said A not B logic comprising said data edge detect pulse.

8. The transition sorting circuit of claim 2, wherein said extraction circuit detects falling edge transitions of the serial stream and outputs a data edge detect pulse of predetermined length in response to each detected transition, said extraction circuit further comprising:

a delay element having a delay length Q; and an A not B logic circuit having an A input and a B input, the B input to said A not B logic circuit and an input to said delay element each being coupled to receive the serial data stream, the output of said delay element being coupled to the A input of said A not B logic circuit, an output pulse from said A not B logic circuit comprising said data edge detect pulse.

9. The transition sorting circuit of claim 2, wherein said extraction circuit detects both rising edge transitions and falling edge transitions of the serial data stream and outputs a dta edge detect pulse of predetermined length in response to each detected transition, said extraction circuit further comprising:

a delay element having a delay length Q; and an exclusive-OR logic circuit having a first input and a second input, the first input to said exclusive-OR logic circuit and an input to said delay element each being coupled to receive the serial data stream, an output of said delay element being coupled to the second input of said exclusive-OR logic circuit, an output pulse from said exclusive-OR logic circuit comprising said data edge detect pulse.

10. The transition sorting circuit of claim 2, wherein said nonsequential logic circuitry further comprises combinational logic circuitry.

11. The transition sorting circuitry of claim 10, wherein said combinational logic circuitry further comprises individual combinational circuit cells.

12. The transition sorting circuit of claim 11, wherein said delay line includes n serially connected delay elements which output $f(0), f(1) \ldots f(n-1)$ & $f(n)$ delay clocks of different phase, and wherein said combinational logic circuitry comprises n substantially identical combinational logic circuit cells and the mth combinational circuit cell comprises:

an AND gate having a first input and a second input, the first input to said AND gate being coupled to receive said extraction circuit output data edge detect pulse; and an A not B logic circuit, said A not B logic circuit having a first input and a second input, the first input of said A not B logic circuit being coupled to receive the $f(m-1)$ delay clock and the second input to said A not B logic circuit being coupled to receive the $f(m)$ delay clock, wherein $m=1,2 \ldots n$, an output of said A not B logic circuit being coupled to the second input of said AND gate.

13. The transition sorting circuit of claim 12, wherein said A not B logic circuit includes an A input and a B input, said A input comprising said first input to said A not B logic circuit and said B input comprising said second input to said AnB logic circuit.

14. A circuit for phase sorting an edge transition of a serial data stream relative to a local clock signal, said transition sorting circuit comprising:

an extraction circuit coupled to receive said serial data stream for detecting said edge transition in the serial stream and outputting a dta edge detect pulse of predetermined length in response thereto;

a delay line having an input coupled to receive the local clock signal, said delay line having a plurality of serially connected delay elements, each of said delay elements outputting a delay clock of different phase; and nonsequential logic circuitry coupled to the output of said extraction circuit and to said local clock through said delay line, said nonsequential logic circuitry combining said data edge detect pulse and said plurality of delay clocks for sorting said data edge detect pulse relative to said delay clocks, said nonsequential logic circuitry outputting a signal pulse representative of the location of said edge transition relative to the local clock signal.

15. The transition sorting circuit of claim 14, wherein said serial data stream includes edge transitions definitive of clock signals and data signals and wherein said transition sorting circuit sorts a plurality of edge transitions of said data stream.

16. The transition sorting circuit of claim 15, wherein said extraction circuit detects at least one of rising edge type transitions and falling edge type transitions of the serial dta stream and outputs a data edge detect pulse of predetermined length in response to each detected edge transition.

17. The transition sorting circuit of claim 16, wherein each output data edge detect pulse of predetermined length of said extraction circuit has a duration Q, duration Q being less than the length of the delay of each of said delay line delay elements.

18. The transition sorting circuit of claim 17, wherein said nonsequential logic circuitry further comprises combinational logic circuitry.

19. The transition sorting circuitry of claim 17, wherein said combinational logic circuitry further comprises n combinational logic circuit cells.

20. The transition sorting circuit of claim 19, wherein said delay line includes n serially connected delay elements which output f(0), f(1) . . . f(n-1) & f(n) delay clocks of different phase, and wherein each of said n combinational logic circuit cells is substantially identical and the mth combinational logic circuit cell comprises:

an AND gate having a first input and a second input, the first input to said AND gate being coupled to receive said extraction circuit output data edge detect pulse of predetermined length; and an A not B logic circuit, said A not B logic circuit having an A input and a B input, the A input to said A not B logic circuit being coupled to receive the f(m-1) delay clock and the B input to said A not B logic circuit being coupled to receive the f(m) delay clock, wherein m=1,2 . . . n, an output of said A not B logic circuit being coupled to the second input of said AND gate.

* * * * *

UNITED STATES PATENT AND TRADEMARK OFFICE
CERTIFICATE OF CORRECTION

PATENT NO. : 5,212,716
DATED : May 18, 1993
INVENTOR(S) : Ferraiolo et al.

It is certified that error appears in the above-identified patent and that said Letters Patent is hereby corrected as shown below:

Column 5, line 10, delete "an" (3rd occur.) and substitute therefor --AND--.

Column 8, line 6, delete "dta" and substitute therefor --data--.
Column 8, line 49, delete "AnB" and substitute therefor --A not B--.
Column 8, line 55, delete "dta" and substitute therefor --data--.
Column 9, line 12, delete "dta" and substitute therefor --data--.

Signed and Sealed this

Eleventh Day of January, 1994

BRUCE LEHMAN

*Attest:*

*Attesting Officer*      *Commissioner of Patents and Trademarks*